(12) United States Patent
Kim et al.

(10) Patent No.: US 7,379,149 B2
(45) Date of Patent: May 27, 2008

(54) LOW TEMPERATURE ACTIVE MATRIX DISPLAY DEVICE AND METHOD OF FABRICATING THE SAME

(75) Inventors: Yong Hae Kim, Daejeon (KR); Choong Heui Chung, Daejeon (KR); Jin Ho Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 410 days.

(21) Appl. No.: 11/262,264

(22) Filed: Oct. 28, 2005

(65) Prior Publication Data
US 2006/0138922 A1    Jun. 29, 2006

(30) Foreign Application Priority Data
Dec. 16, 2004    (KR) .................. 10-2004-0107026

(51) Int. Cl.
G02F 1/1333    (2006.01)
G02F 1/1343    (2006.01)
(52) U.S. Cl. .................. 349/158; 349/38; 349/39
(58) Field of Classification Search ........ 349/158, 349/38
See application file for complete search history.

(56) References Cited

U.S. PATENT DOCUMENTS

| 6,686,588 | B1* | 2/2004 | Webster et al. ........... 250/239 |
| 7,129,636 | B2* | 10/2006 | Chang .................. 313/506 |
| 2004/0169460 | A1* | 9/2004 | Chang et al. ............ 313/498 |
| 2005/0045885 | A1* | 3/2005 | Kim et al. ............... 257/66 |
| 2005/0218798 | A1* | 10/2005 | Chang .................. 313/506 |
| 2006/0113900 | A1* | 6/2006 | Oh ..................... 313/504 |
| 2007/0132374 | A1* | 6/2007 | Park ................... 313/504 |

FOREIGN PATENT DOCUMENTS

| KR | 10-2003-75767 | 9/2003 |
| KR | 2003-0082139 A | 10/2003 |
| WO | WO 02/037570 A2 | 5/2002 |

OTHER PUBLICATIONS

IEEE Electron Device Letters, vol. 25, No. 7, Jul. 2004, pp. 486-488.

* cited by examiner

*Primary Examiner*—Mike Qi
(74) *Attorney, Agent, or Firm*—Blakely, Sokoloff, Taylor & Zafman LLP

(57) ABSTRACT

Provided are a low temperature active matrix display device using a plastic substrate and method of fabricating the same. The low temperature active matrix display device includes: a plastic substrate; a reflection layer disposed on the plastic substrate; a buffer layer disposed on the reflection layer; a thin film transistor disposed on the buffer layer in a first region of the plastic substrate; an interlayer dielectric layer disposed on the thin film transistor; a capacitor disposed in a trench formed in a second region of the plastic substrate and having a first electrode connected to a source electrode and a drain electrode of the thin film transistor, the trench extending from the interlayer dielectric layer to the reflection layer; and a display device having one electrode connected to a second electrode of the capacitor. The above-described structure includes photoresist spacers to decrease a leakage current from the TFT, includes a reflector to protect the plastic substrate from deformation due to laser irradiation, and employs a three-dimensional capacitor to increase an aperture ratio.

5 Claims, 3 Drawing Sheets

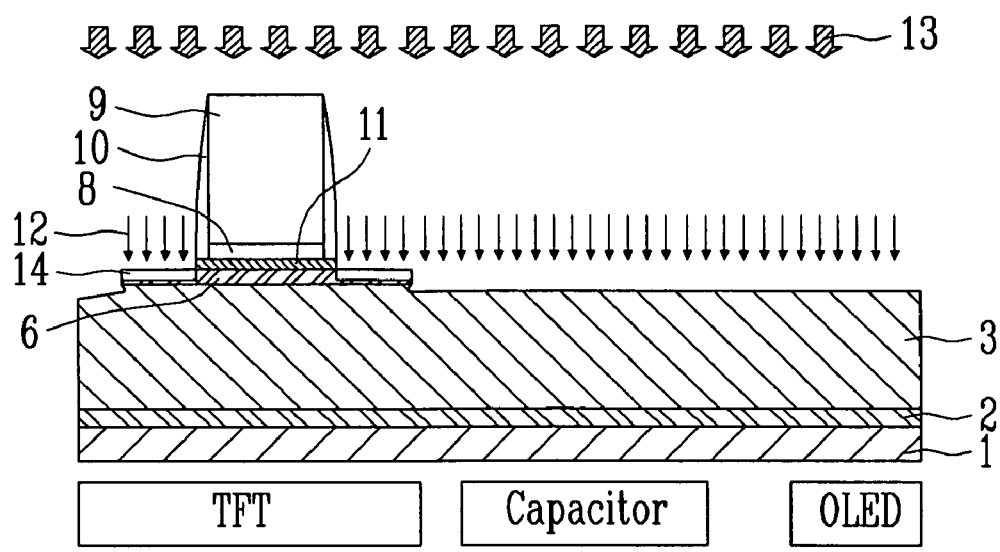
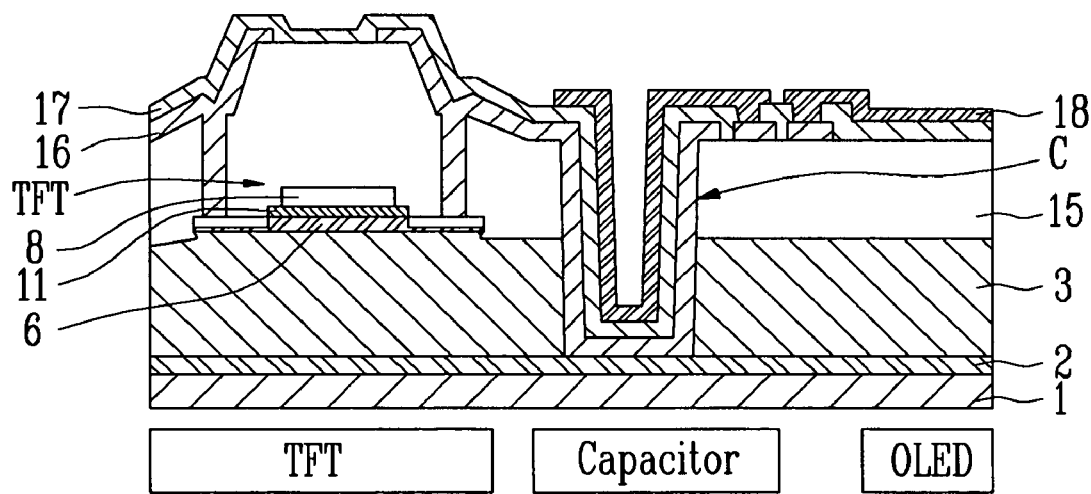

LOW TEMPERATURE ACTIVE MATRIX DISPLAY DEVICE AND METHOD OF FABRICATING THE SAME

CROSS-REFERENCE TO RELATED APPLICATION

This application claims priority to and the benefit of Korean Patent Application No. 2004-107026, filed Dec. 16, 2004, the disclosure of which is incorporated herein by reference in its entirety.

BACKGROUND

1. Field of the Invention

The present invention relates to an active matrix display device using a plastic substrate and method of fabricating the same.

2. Discussion of Related Art

FIG. 1 is a cross-sectional view of a conventional active matrix display device. Referring to FIG. 1, the conventional active matrix display device is a device that displays a unit image of a predetermined display and includes a thin film transistor (TFT), a capacitor (C), and an organic light emitting diode (OLED). Here, the TFT is formed on a buffer layer 3a in a first region of a substrate 1a, and the capacitor C is formed on an interlayer dielectric layer 15a in a second region of the substrate 1a.

In the above-described conventional active matrix display device, an activated active region can be defined in the TFT using lithography equipment, in the case of using a glass substrate. However, in the case of using a plastic substrate, it is impossible to define the activated region in the TFT using the lithography equipment because the plastic substrate is deformed. If the activated region is disposed adjacent to a gate, an excessive leakage current occurs from the TFT so that the OLED cannot operate.

Also, during a low temperature activation process using a laser, the glass substrate passes the laser and avoids being deformed, whereas the plastic substrate absorbs the laser and suffers from thermal deformation.

To prevent the thermal deformation of the plastic substrate, some manufacturers may adopt a process operation of etching an active region after an activation process using a laser. However, in this case, a leakage current occurs between devices through a gate terminal, so that the OLED cannot operate.

Further, since the plastic substrate requires a sufficient alignment margin in comparison to the glass substrate, the area of the capacitor C in the unit pixel is greatly increased and an aperture ratio is notably reduced. Therefore, the conventional active matrix display device needs to form a large-sized capacitor in a small area.

SUMMARY OF THE INVENTION

The present invention is directed to a low temperature active matrix display device and method of fabricating the same, which can solve a leakage current from a thin film transistor (TFT), the deformation of a plastic substrate, and a reduction in aperture ratio caused by an increase in the area of a capacitor.

One aspect of the present invention is to provide a low temperature active matrix display device including: a plastic substrate; a reflection layer disposed on the plastic substrate; a buffer layer disposed on the reflection layer; a thin film transistor disposed on the buffer layer in a first region of the plastic substrate; an interlayer dielectric layer disposed on the thin film transistor; a capacitor disposed in a trench formed in a second region of the plastic substrate and having a first electrode connected to a source electrode and a drain electrode of the thin film transistor, the trench extending from the interlayer dielectric layer to the reflection layer; and a display device having one electrode connected to a second electrode of the capacitor.

The TFT may include an offset region disposed between a gate metal and an activated active region.

Another aspect of the present invention is to provide a method of fabricating a low temperature active matrix display device including a TFT, a capacitor, and a display device disposed on a plastic substrate. The method includes: forming an offset region between a gate metal and an activated active region of the thin film transistor, wherein forming the offset region includes patterning the gate metal using a first photoresist, thermally treating the resultant structure such that the first photoresist left on the patterned gate metal is not developed, and coating a second photoresist and exposing the second photoresist without a mask to form photoresist spacers; and etching a gate dielectric layer using the first photoresist and the photoresist spacers as a mask, removing the first photoresist and the photoresist spacers, implanting impurity ions into the activated active regions, and activating both sides of the active region using laser.

The method may further include depositing a reflector on the plastic substrate to protect the plastic substrate, the reflector for reflecting the laser; and depositing a buffer layer on the reflector to protect the reflector and the plastic substrate from the thermal treatment.

Also, the method may further include forming a capacitor in a three-dimensional manner. Here, forming the capacitor includes forming a trench by etching an interlayer dielectric layer and the buffer layer formed on the TFT using the reflector as an etch stop layer during formation of contact holes in the activated active regions; forming a first electrode of the capacitor in the trench during formation of a source electrode and a drain electrode of the TFT; depositing a capacitor dielectric layer; and forming a second electrode of the capacitor during formation of a first electrode of the display device.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 3A through 3D are cross-sectional views illustrating exemplary operations for fabricating a low temperature active matrix display device according to the present invention.

DETAILED DESCRIPTION OF EXEMPLARY EMBODIMENTS

Figure 1:
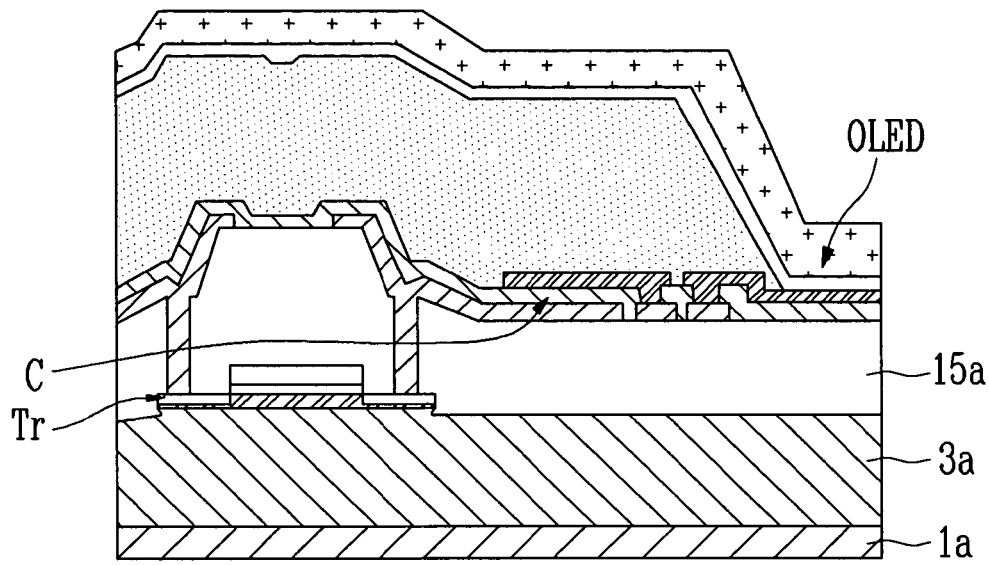
FIG. 1 is a cross-sectional view of a conventional active matrix display device.

The present invention will now be described more fully hereinafter with reference to the accompanying drawings, in which exemplary embodiments of the invention are shown. It will also be understood that when a layer is referred to as being "on" another layer or substrate, it can be directly on the other layer or substrate or intervening layers may also be present. In the drawings, the thickness of layers and regions are exaggerated for clarity. The same reference numerals are used to denote the same elements throughout the specification.

Figure 2:
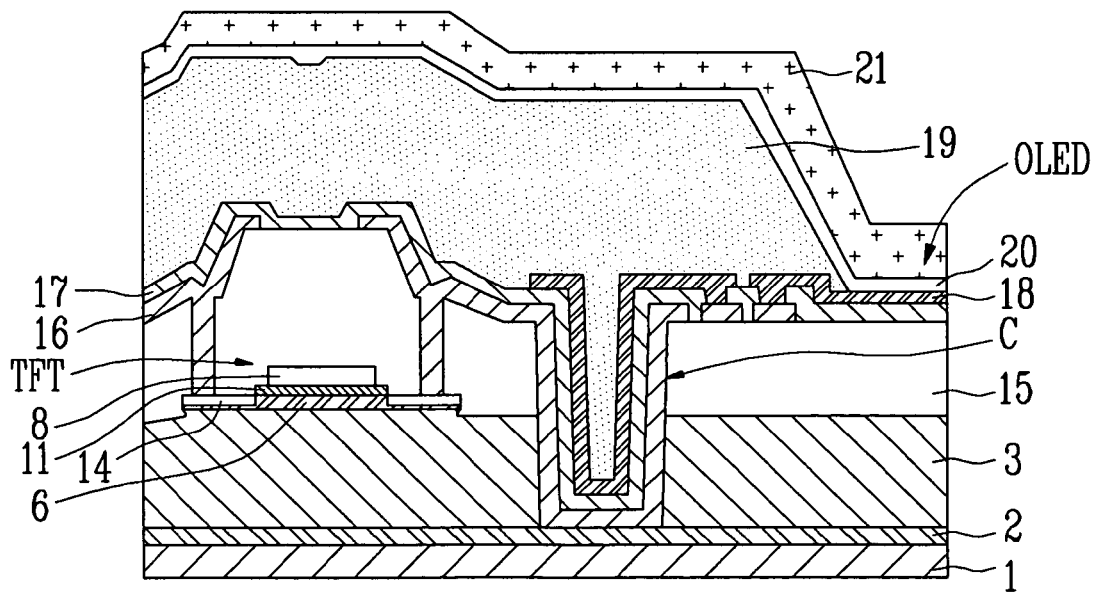
FIG. 2 is a cross-sectional view of a low temperature active matrix display device according to an exemplary embodiment of the present invention.

FIG. 2 is a cross-sectional view of a low temperature active matrix display device according to an exemplary embodiment of the present invention.

Referring to FIG. 2, the low temperature active matrix display device is a device that displays a unit image of a predetermined display and an organic light emitting diode (OLED) is controlled by a thin film transistor (TFT) and a capacitor C to display a predetermined image. For this function, the low temperature active matrix display device includes a plastic substrate 1, a reflection layer 2, a buffer layer 3, a TFT, an interlayer dielectric layer 15, a capacitor C, a bank 19, and an OLED.

The TFT includes a gate 8, which is disposed opposite to an active region 6 by interposing a gate insulating layer 11 therebetween. The active region 6 includes activated active regions 14 at its both edge portions. The activated active regions 14 correspond to a source region and a drain region, respectively.

The capacitor C is formed in the three-dimensional manner in a trench that is concavely formed and extends from the interlayer dielectric layer 15 to the reflection layer 2. A first electrode of the capacitor C is formed of a first metal layer 16 required for forming source and drain electrodes of the TFT, and a second electrode thereof is formed of a second metal layer 18 required for forming a first electrode of the OLED. A capacitor dielectric layer 17 is formed between the first and second electrodes of the capacitor C.

The OLED includes an emission layer 20 formed of an organic material and a first electrode and a second electrode, which are connected to both surfaces of the emission layer 20, respectively. The first and second electrodes of the OLED are formed using the second metal layer 18 and a third metal layer 21, respectively. Also, the first and second electrodes of the OLED correspond to an anode and a cathode, respectively.

Owing to the above-described construction, the deformation of the plastic substrate 1 can be prevented during the fabrication process, and the three-dimensional capacitor leads to an increase in aperture ratio.

FIGS. 3A through 3D are cross-sectional views illustrating exemplary operations for fabricating a low temperature active matrix display device according to the present invention.

Figure 3A:
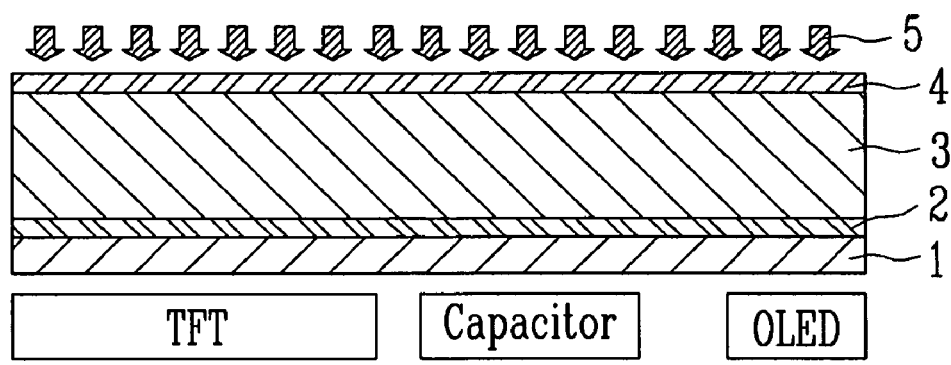

At the outset, referring to FIG. 3A, a reflector 2 is deposited on a plastic substrate 1, and a buffer layer 3 is formed thereon. Here, the reflector 2 is formed of a material with a high reflectivity to laser irradiation, for example, aluminum (Al). Thereafter, an amorphous silicon (a-Si) layer 4 is deposited and crystallized using laser irradiation 5 to form a polysilicon (poly-Si) layer. The reflector 2 and the buffer layer 3 correspond to the reflection layer and the buffer layer, respectively, as described with reference to FIG. 2.

Figure 3B:
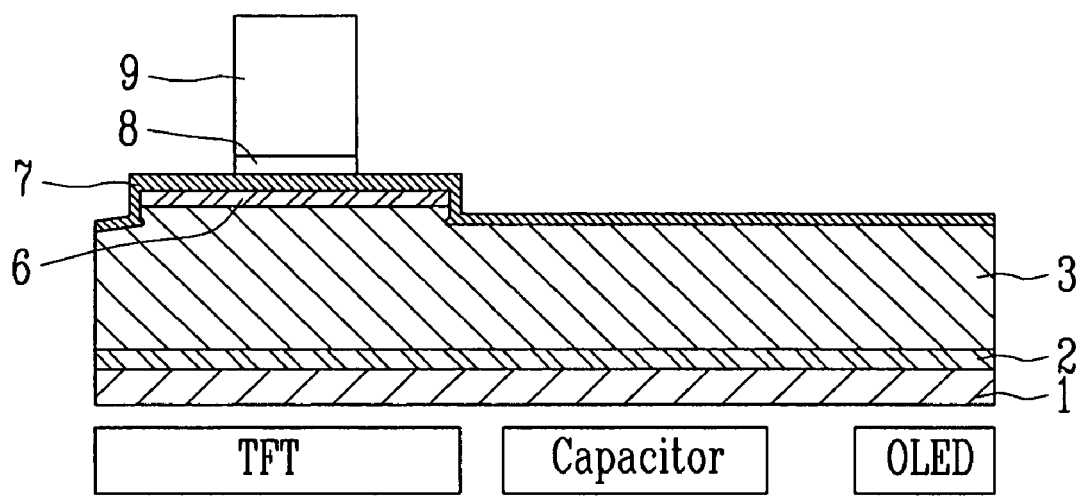

Referring to FIG. 3B, the poly-Si layer is etched to form an active region 6, and a gate dielectric layer 7 and a gate metal layer are deposited. In this case, the gate metal layer is formed of a material with a high reflectivity to laser irradiation, for example, Al. Subsequently, a photoresist layer is coated using a spin coating process, and the photoresist layer and the gate metal layer are patterned using photolithography and etching processes, thereby forming a photoresist pattern 9 and a gate metal pattern 8. Thereafter, the resultant structure is baked using an oven at a temperature of about 140° C. such that the photoresist pattern 9 present on the gate metal pattern 8 is not developed any longer.

Referring to FIG. 3C, an additional photoresist layer is coated using a spin coating process and then exposed without any mask. Thus, during a subsequent developing process, the photoresist pattern 9 is not removed under the influence of the thermal treatment, whereas the additional photoresist layer is developed so that only its thick portion is left as photoresist spacers 10 on both lateral surfaces of the photoresist pattern 9. Thereafter, the gate dielectric layer 11 is etched so that offset regions are formed as much as the photoresist spacers 10 between activated active regions 14 and the gate metal pattern 8.

Thereafter, the photoresist pattern 9 and the photoresist spacers 10 are removed, and the activated active regions 14 are doped with impurity ions using an ion implantation process 12 and activated using laser 13. In this case, the doped activated active regions 14 are activated, whereas the undoped offset regions are not activated. Also, since the laser 13 is reflected by the reflector 2 in the buffer layer 3 that is not covered with polysilicon and is externally exposed, the plastic substrate 1 is neither deformed nor damaged by the laser 13.

Referring to FIG. 3D, an interlayer dielectric layer 15 is formed of a predetermined insulating material and etched to form contact holes in the activated active regions 14. At the same time, to form a three-dimensional capacitor C, the interlayer dielectric layer 15 and the buffer layer 3 are etched using the reflector 2 as an etch stop layer in a capacitor forming region. Thus, a trench for the capacitor C is obtained. Subsequently, a first metal layer 16 is deposited and patterned using photolithography and etching processes, thereby forming a source electrode and a drain electrode of the TFT and a first electrode of the capacitor C. A capacitor dielectric layer 17 is deposited using a process having good step coverage, such as an atomic layer deposition (ALD) process. Then, a second metal layer 18 is deposited and patterned using photolithography and etching processes, thereby forming an anode of the OLED and a second electrode of the capacitor C.

Thereafter, a bank (19 of FIG. 2) is formed by depositing a predetermined material and patterning the same. A predetermined material for forming an emission layer (20 of FIG. 2) of the OLED and a third metal layer (21 of FIG. 2) for forming a cathode of the OLED are deposited on the resultant structure. In this process, the low temperature active matrix display device as shown in FIG. 2 is completed.

As explained thus far, the present invention provides a low temperature active matrix display device using a plastic substrate that is liable to thermal deformation and absorption of laser in comparison to a glass substrate. Also, the low temperature active matrix display device according to the present invention has the following advantages.

First, offset regions are formed between a gate metal pattern and an activated active region, thus reducing a leakage current from a TFT.

Second, a reflector is formed on a plastic substrate so that the plastic substrate can be protected from thermal deformation during a laser activation process.

Third, a capacitor is formed in a three-dimenstional manner, thus the area of the capacitor in a pixel decreases to improve aperture ratio.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A low temperature active matrix display device comprising:
   a plastic substrate;
   a reflection layer disposed on the plastic substrate;
   a buffer layer disposed on the reflection layer;
   a thin film transistor disposed on the buffer layer in a first region of the plastic substrate;
   an interlayer dielectric layer disposed on the thin film transistor;
   a capacitor disposed in a trench formed in a second region of the plastic substrate and having a first electrode connected to a source electrode and a drain electrode of the thin film transistor, the trench extending from the interlayer dielectric layer to the reflection layer; and
   a display device having one electrode connected to a second electrode of the capacitor.

2. The low temperature active matrix display device according to claim 1, wherein the thin film transistor includes an offset region disposed between a gate metal and an activated active region.

3. A method of fabricating a low temperature active matrix display device including a thin film transistor, a capacitor, and a display device disposed on a plastic substrate, the method comprising:
   forming an offset region between a gate metal and an activated active region of the thin film transistor, wherein forming the offset region includes patterning the gate metal using a first photoresist, thermally treating the resultant structure such that the first photoresist left on the patterned gate metal is not developed, and coating a second photoresist and exposing the second photoresist without a mask to form photoresist spacers; and
   etching a gate dielectric layer using the first photoresist and the photoresist spacers as a mask, removing the first photoresist and the photoresist spacers, implanting impurity ions into the activated active regions, and activating both sides of the active region using laser.

4. The method according to claim 3, further comprising:
   depositing a reflector on the plastic substrate to protect the plastic substrate, the reflector for reflecting the laser; and
   depositing a buffer layer on the reflector to protect the reflector and the plastic substrate from the thermal treatment.

5. The method according to claim 4, further comprising forming a capacitor in a three-dimensional manner,
   wherein forming the capacitor includes:
   forming a trench by etching an interlayer dielectric layer and the buffer layer formed on the thin film transistor using the reflector as an etch stop layer during formation of contact holes in the activated active regions;
   forming a first electrode of the capacitor in the trench during formation of a source electrode and a drain electrode of the thin film transistor;
   depositing a capacitor dielectric layer; and
   forming a second electrode of the capacitor during formation of a first electrode of the display device.

* * * * *